(12) United States Patent
deVilliers

(10) Patent No.: US 9,378,974 B2
(45) Date of Patent: Jun. 28, 2016

(54) METHOD FOR CHEMICAL POLISHING AND PLANARIZATION

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/532,717

(22) Filed: Nov. 4, 2014

(65) Prior Publication Data

US 2015/0140825 A1  May 21, 2015

Related U.S. Application Data

(60) Provisional application No. 61/901,768, filed on Nov. 8, 2013.

(51) Int. Cl.
| | |
|---|---|
| *H01L 21/3105* | (2006.01) |
| *H01L 21/306* | (2006.01) |
| *H01L 21/321* | (2006.01) |
| *H01L 21/027* | (2006.01) |
| *H01L 21/32* | (2006.01) |
| *G03F 7/09* | (2006.01) |

(52) U.S. Cl.
CPC .......... *H01L 21/31056* (2013.01); *G03F 7/094* (2013.01); *H01L 21/0276* (2013.01); *H01L 21/30604* (2013.01); *H01L 21/31058* (2013.01); *H01L 21/32* (2013.01); *H01L 21/32115* (2013.01)

(58) Field of Classification Search
CPC ................... H01L 21/31056; H01L 21/31058; H01L 21/30604; H01L 21/32115; H01L 21/32; H01L 21/0276; H01L 21/31144; H01L 21/481; H01L 21/76808; H01L 21/02118; H01L 21/0228; H01L 21/02282; G03F 1/00; G03F 7/0035; G03F 7/094
USPC ........................................................ 438/703
See application file for complete search history.

(56) References Cited

U.S. PATENT DOCUMENTS

| | | | | |
|---|---|---|---|---|
| 6,187,683 | B1 * | 2/2001 | De Santi | ........... H01L 21/31051 257/E21.243 |
| 6,337,242 | B1 * | 1/2002 | Park | ..................... H01L 27/0629 257/E27.016 |
| 2001/0014539 | A1 | 8/2001 | Skrovan et al. | |

(Continued)

OTHER PUBLICATIONS

International Search Report issued in International Patent Application PCT/US14/63886 dated Jan. 21, 2015.

(Continued)

*Primary Examiner* — Caleen Sullivan
(74) *Attorney, Agent, or Firm* — DLA Piper LLP US

(57) ABSTRACT

A chemical planarization process described herein can be used for planarizing a substrate without using mechanical abrasion. A developable planarization material can be applied to a substrate having a non-planar topography, such that a planar surface results. The resulting planarization layer can cover existing structures on the substrate. A top portion of the planarization layer can be solubilized using a solubility-changing agent, and then the soluble portion can be removed thereby slimming a height of the planarization material to a target value, which can be a top surface of a tallest underlying structure. With the substrate planarized, additional patterning operations can be executed.

20 Claims, 3 Drawing Sheets

(56) References Cited

U.S. PATENT DOCUMENTS

| | | |
|---|---|---|
| 2002/0022196 A1 | 2/2002 | Pavelchek et al. |
| 2004/0077180 A1 | 4/2004 | Sebald |
| 2005/0171277 A1 | 8/2005 | Li et al. |
| 2009/0159948 A1* | 6/2009 | Ho .................... H01L 28/91 257/301 |
| 2009/0236310 A1 | 9/2009 | Linder et al. |
| 2010/0213580 A1 | 8/2010 | Meador et al. |
| 2012/0177891 A1 | 7/2012 | Millward et al. |
| 2013/0034965 A1* | 2/2013 | Kim .................... H01L 21/0274 438/703 |

OTHER PUBLICATIONS

Written Opinion of the International Searching Authority issued in International Patent Application PCT/US14/63886 dated Jan. 21, 2015.

* cited by examiner

METHOD FOR CHEMICAL POLISHING AND PLANARIZATION

CROSS REFERENCE TO RELATED APPLICATIONS

The present application claims the benefit of U.S. Provisional Patent Application No. 61/901,768, filed on Nov. 8, 2013, entitled "Method for Chemical Polishing and Planarization," which is incorporated herein by reference in its entirety.

BACKGROUND OF THE INVENTION

This invention relates to microfabrication including microfabrication of integrated circuits. Semiconductor manufacturing includes photolithography processes. Some lithography processes include coating a wafer with a thin film of bottom anti-reflective coating (BARC) material, followed by coating with a resist, and then exposing the wafer to a pattern of light as a process step for creating microchips. Photolithography processes typically require a planar surface for depositing the various films and resists used to pattern a wafer. Films typically are specified to have a particular height and be planarized to within certain specifications, depending on a given deposition process.

Planarization is commonly performed using Chemical Mechanical Polishing/Planarization (CMP). CMP is a process that uses corrosive chemicals and a polishing pad to planarize the surface of a wafer. CMP can planarize insulators and conductors in multilevel structures. This planarization is used to stack more electronics onto another layer of a wafer, or to planarize the wafer for photo lithographic patterning. CMP is also used to fine tune the lithographic exposure process by setting a resist to a known height to optimize the exposure area.

BARC is a thin film that is placed between the substrate and the resist layer to absorb the remaining light rays during an exposure to prevent rough edges created by reflected light rays during exposure. BARC can also used between multiple layer exposures to protect the previously exposed layers from being exposed again.

SUMMARY

Although chemical mechanical planarization can provide a planar surface on a wafer, there are limitations and drawbacks to using CMP. CMP is typically executed by applying spin-on glass (SCG) on a wafer and then using corrosive chemicals and physical abrasion. Thus, CMP is a very harsh and physically abrasive process compared to other microfabrication techniques. CMP, therefore, cannot be used for many process steps of microfabricating an integrated circuit. For example, CMP cannot be used for microfabricating transistors and other front-end-of-line structures—especially when a gate oxide is exposed. Moreover, CMP processes are very expensive to run, challenging to perform, and typically reduce yield of functional integrated circuits.

Techniques disclosed herein provide a chemical planarization process without mechanical polishing. Techniques include using a developable planarization material, and slimming a height of this planarization material to a target value. For example, developer soluble bottom anti-reflective coating (DBARC) is a BARC that simultaneously develops with a photoresist. Using silicon (Si) DBARC—or other developer fill material—a wafer with constructed features can be planarized without using CMP. In one specific example, an entire wafer is coated with a relatively large amount of Si-DBARC, which provides a planar film over non-planar structures. The Si-DBARC is then coated with acid to remove an amount of Si-DBARC in a vertical direction down to a set stopping point by solubilizing and dissolving this material, thereby planarizing the wafer. After the wafer is planarized, semiconductor manufacturing processing can continue and skip any CMP steps, thereby saving time and money. This technique disclosed herein can be referred to as a Chemical Polishing and Planarization (CPP) process. This CPP process enables structures to be built or patterned on multiple layers (such as multiple elevations) at one time with a wafer remaining in a coater/developer tool such as a track tool. This method can thus remove a plasma etch step (eliminates two transport steps), can save substrates, and can provide more flexibility in choosing a resist for subsequent patterning.

One embodiment includes a method for planarizing a substrate that comprises several steps. A substrate is received or created having microfabricated structures that differ in height relative to each other such that the microfabricated structures define a non-planar topography across an upper portion of the substrate. A planarizing film is deposited on the substrate such that the planarizing film yields a first planar surface on the upper portion of the substrate. The planarizing film includes a solubility-changeable material. A solubility-changing agent is then deposited on the first planar surface of the planarizing film. The solubility-changing agent is activated such that the solubility-changing agent changes a solubility of a top portion of the planarizing film. The top portion of the planarizing film has a thickness extending vertically from the first planar surface of the planarizing film to a predetermined depth within the planarizing film. This top portion of the planarizing film is then removed resulting in the substrate having a planar surface at a target height or vertical point on the substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, ii is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
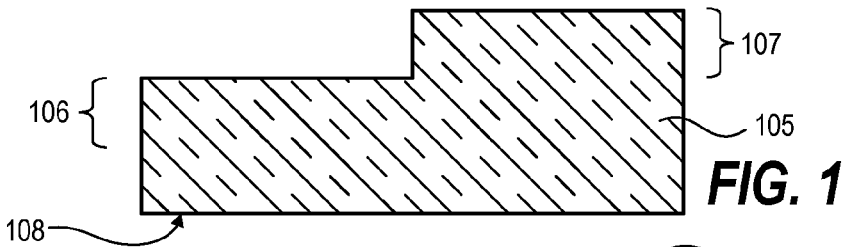
FIG. 1 is a cross-sectional schematic view of an example substrate segment showing a process flow according to embodiments disclosed herein.

Techniques disclosed herein provide a chemical planarization process that can planarize a substrate without using mechanical abrasion. Techniques include depositing a developable planarization material, and then slimming a height of the planarization material to a target value using a solubility-changing agent. Chemical polishing and planarization (CPP) processes can be used when a substrate (such as a silicon wafer) has topographical features such as lines, plateaus, trenches, holes, or other structures.

A thin film of a planarizing, developable material (such as Si-DBARC) is applied to the substrate by spin coating, spray coating, or dip coating techniques so that the thin film covers all structures completely. Next a thin coat or relatively small amount of a solubility-changing agent (such as a temperature acid generator (TAG) or other compatible acid) is applied via spin coating, spray coating, vapor exposure, or dip coating techniques. The solubility-changing agent can then diffuse into or chemically alter a top layer of the planarizing film (Si-DBARC) without affecting or changing an entire planarizing film depth. This top layer or top portion, for example, can have a thickness extending between a top surface of the planarizing film and a top surface of a highest structure on the substrate (tallest underlying structure), or to a point above the highest structure. If a TAG is used, then the amount of acid released can be finely controlled by a temperature and duration of baking. Baking a TAG will release a specified amount of acid to reach a specified or target depth. This top layer can then be dissolved and washed away with a developing step, similar to conventional developing of photoresist materials. This creates a smooth, even plane on top of the substrate. Subsequent baking of the Si-DBARC at a hotter temp can be executed to harden the Si-DBARC and make it undevelopable. Thus, the conventional CMP process can be completely replaced with developer-based planarization techniques as disclosed herein. Developer-based planarization also enables structures to be added via lithography, and for etching at multiple heights simultaneously on a substrate. New structures can be created in one pass on top of any existing structures regardless of current height differentials, thereby reducing a number of required passes to complete a given microchip fabrication process.

Techniques herein include wet slimming planarization techniques, which can be implemented using diffusion-limited developer steps. Instead of using spin-on glass followed by CMP, techniques herein use a developable fill-coat material. Developable materials are materials that interact with photo acids, acids, and/or bases and change their solubility in response. In the past, developable materials, when deposited, formed generally conformal films (that is, films that assumed a topography of a structure). Recently, however, materials that exhibit non-conformal deposition behavior (films that can create a planar layer) have been made developable. By making such materials developable, resulting films can interact with developer solutions and/or have some differential solubility (ability to have a solubility changed).

Solubility-changing agents (such as an acid or photo acid) can diffuse into a developable material with accurate control, such as diffusing to a specified number of nanometers, for example. Note that photo acids used herein does not need lithographic exposure for activation. For example a photo acid can be synthesized that has already been exposed, so there is no exposure needed. Instead, the solubility-changing agent process can be a temperature-based and/or a time-based process, with light-based processing still available as an alternative. Accordingly, techniques herein can use a temperature acid generator process instead of scanner process. Photo acid can be introduced as a material on a developable planar layer. This photo acid material is then baked down from the top to a known diffusion length, such as to the top of a tallest structure covered by the developable planarizing film. The photo acid can be baked down a known length to stop on queue. The amount of acid used, time of baking and temperature of baking is dependent on type of planarizing film and target diffusion depth. Conventional data for wet slimming of lateral critical dimensions can be translated and extrapolated to identify sufficient baking temperatures, bake times, and solubility-changing agents.

FIGS. 1-9 are cross-sectional schematic diagrams an example substrate segment illustrating various steps of chemical planarization of a non-planar substrate using coater/developer tool-based planarization process for planarizing a substrate. A first step is receiving, creating, or otherwise providing a substrate having microfabricated structures that differ in height relative to each other such that the microfabricated structures define a non-planar topography across an upper portion of the substrate. FIG. 1 shows substrate 105 having a non-planar topography. Note that structure 107 is taller than structure 106 relative to a bottom surface 108 (undersurface) of substrate 105. By way of a non-limiting example, structures can be a fin structure and gate structure of a FinFET (fin field effect transistor) device being fabricated. Note that since the structures are microfabricated, height differences can be on the micrometer scale or nanometer scale and smaller. For example, some structures on a given substrate may differ by several to tens of microns, while structures on another substrate may differ by several nanometers to tens of nanometers in defining a non-planar surface.

Figure 2:
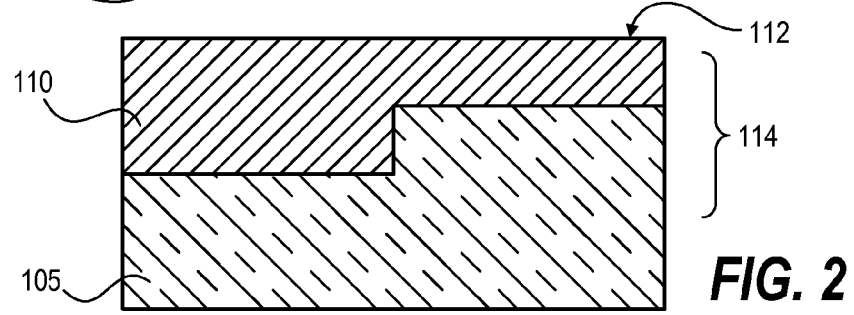
FIG. 2 is a cross-sectional schematic view of an example substrate segment showing a process flow according to embodiments disclosed herein.

Referring now to FIG. 2, after receiving the non-planar substrate 105, a planarizing film 110 is deposited on the substrate such that the planarizing film 110 yields a first planar surface 112 on the upper portion 114 of the substrate 105. The planarizing film includes a solubility-changeable material or otherwise has a composition that can have a solubility shift. Thus, at least one constituent material of the planarizing film can shift a solubility of the planarizing film in response to a particular treatment and/or in response to reacting with one or more solubility-changing agents. Note that such planarization can be relative to initial structures. For example, if the structures differ by 40 nanometers, then the first planar surface 112 can be generally flat but vary in height uniformity up to a few nanometers. Any planarizing material that is capable of being developed in a semiconductor developer tool can be selected. A developable material will interact with certain agents and shift its solubility. Solubility shifts can be either to increase or decrease solubility to a given developer. For example, DBARCs or silicon-containing DBARCs can be used. Anti-reflective coatings are not required, but the benefit of using an ARC is that they are consistent in planarizing capabilities and can fill various types of structures effectively. Photoresists can also be used, but may need some additional engineering to provide acceptable planarization characteristics if particular roughness tolerances are specified. Another option for a planarizing material herein is adding a photosensitizer to a spin-on carbon layer.

Figure 3:
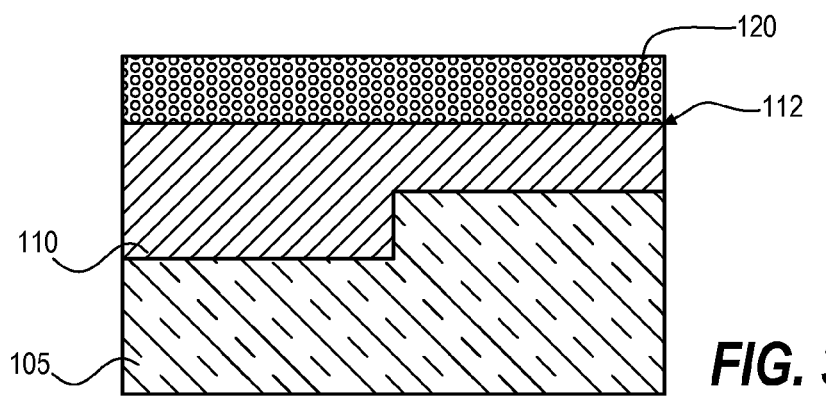
FIG. 3 is a cross-sectional schematic view of an example substrate segment showing a process flow according to embodiments disclosed herein.

Referring now to FIG. 3, a solubility-changing agent 120 is deposited on the first planar surface 112 of the planarizing film 110. The solubility-changing agent 120 can be deposited by spin coating, liquid dispense, dipping, or vapor phase deposition. The solubility-changing agent 120 will interact with the solubility-changeable material to shift a solubility of the planarizing film 110. By depositing the solubility-changing agent 120 on a planar surface (generally planar across the substrate 105) a Z-height shift in solubility can be realized. The solubility-changing agent 120 can be selected from several materials including various acids. If the planarizing film is a type of negative tone resist, for example, then solubility-changing agent 120 can be selected as a base. Compatibilities of various developable materials and solubility-changing agents are within the knowledge of those skilled in microfabrication and photolithography.

Figure 4:
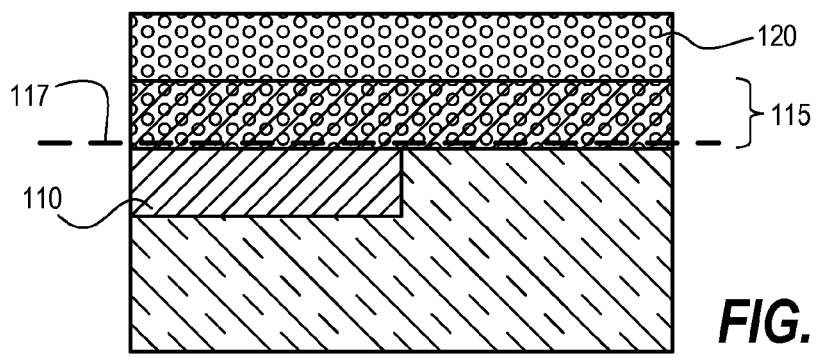
FIG. 4 is a cross-sectional schematic view of an example substrate segment showing a process flow according to embodiments disclosed herein.

Referring now to FIG. 4, techniques can be used to create a Z-height shift in solubility of an upper portion 115 of the planarizing film 110 and stop at a specified location within the planarizing film 110. The solubility-changing agent 120 is activated such that the solubility-changing agent 120 changes a solubility of a top portion 115 of the planarizing film 110. The top portion 115 of the planarizing film 110 can have, for example, a thickness extending vertically from the first planar surface 112 of the planarizing film 110 to a predetermined depth 117 within the planarizing film 110. Though not required, this predetermined depth can extend to a highest structural feature covered by the planarizing film 110.

Figure 10:
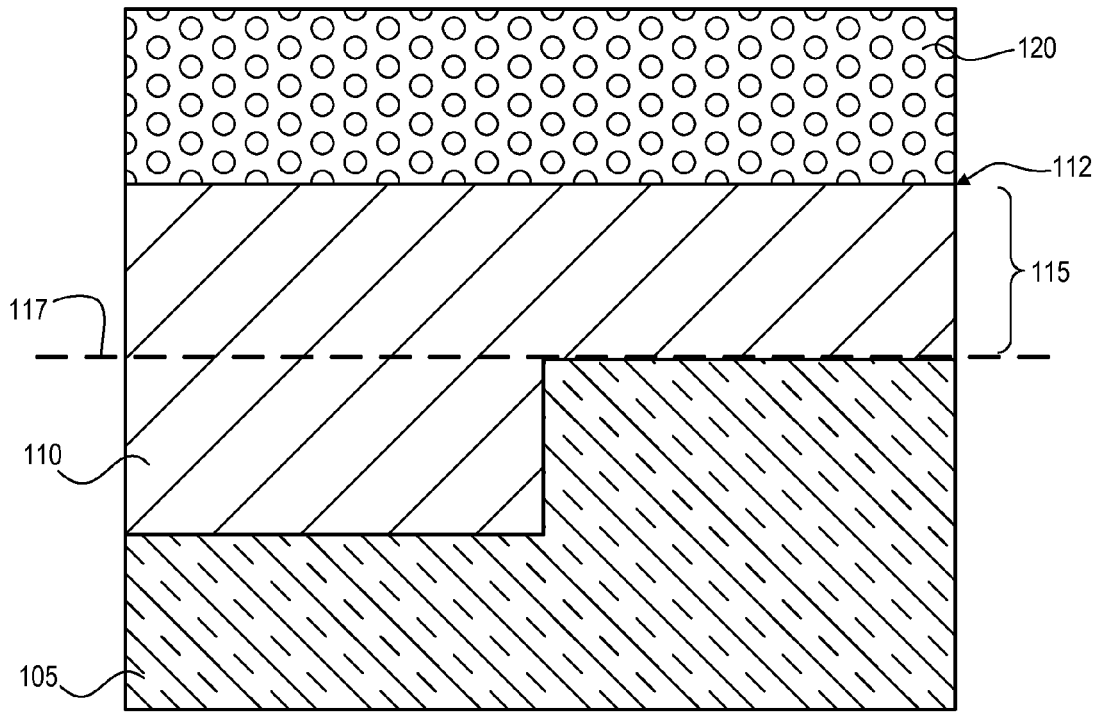
FIG. 10 is a cross-sectional schematic view of an example substrate segment showing a process flow according to embodiments disclosed herein.
Figure 11:
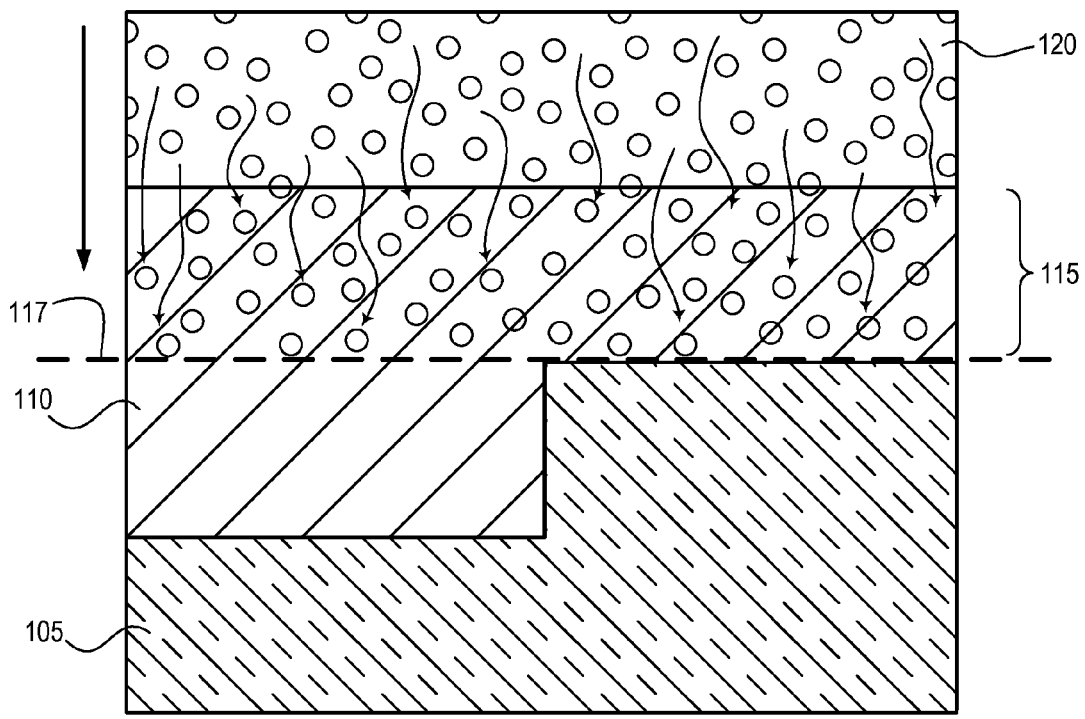
FIG. 11 is a cross-sectional schematic view of an example substrate segment showing a process flow according to embodiments disclosed herein.

Activating the solubility-changing agent 110 can include healing the solubility-changing agent 120 such that the solubility-changing agent 120 diffuses into the planarizing film to the predetermined depth and changes a solubility of the top portion 115 of the planarizing film. FIGS. 10 and 11 show an enlarged schematic view of this activation process. FIG. 10 corresponds to FIG. 3 and shows a solubility-changing agent 120 deposited on the first planar surface 112 of the planarizing film 110. The substrate and/or solubility-changing agent 120 is then heated or otherwise activated. This causes the solubility-changing agent 120 to diffuse downwardly into the planarization film 110. FIG. 11 shows arrows to illustrate the general diffusion flow of the solubility-changing agent 120. Diffusion occurs down to the predetermined depth 117 either by ceasing the activation or providing a specific amount of solubility-changing agent 120 such that diffusion is self-limited. Molecular weights of agents can also be selected to result in self-limited diffusion lengths. Heating the solubility-changing agent can include controlling heating parameters such that diffusion of the solubility-changing agent stops at about the predetermined depth 117. In one example embodiment, the substrate stack is heated to between about 80 C and 100 C.

Thus, activation can be dependent on a specified diffusion length. This diffusion drive or activation step is typically heat. In alternative embodiments, extreme ultra violet (EUV) radiation, UV radiation, or visible light can be used. Microwave heat can optionally be used. Alternatively, heat and UV radiation can be supplied simultaneously to drive activation. UV can be used to turn a conventional photo acid generator (PAG) into a photo acid. Some acids or solubility-changing agents can be self-activating or diffuse without heat activation. Self-activating agents can be deposited and then left on the planarizing layer for a period of time sufficient to diffuse a predetermined depth. Some self-activating agents have a self-limiting diffusion depth that essentially creates a monolayer of soluble material. Thus multiple coatings can be applied and removed until reaching a target depth (or target height above structures).

Figure 5:
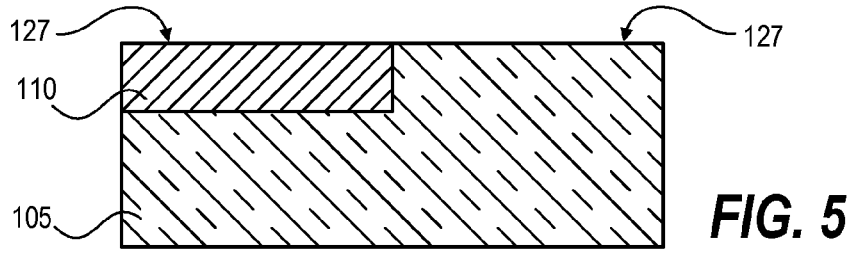
FIG. 5 is a cross-sectional schematic view of an example substrate segment showing a process flow according to embodiments disclosed herein.

Referring to FIG. 5, after changing a solubility of the top portion 115 of the planarization film 110, the top portion 115 is removed resulting in the substrate 105 having a target planar surface 127. Removal can be executed using a chemical developer and developer tool that converts the top portion 115 into a solution that can be washed away. Because this region (upper portion) of the film is now soluble (while a region underneath remains insoluble) it is possible to wash off both photo acid (soluble) and the impacted planarization layer (soluble).

At this point the target planar surface 127 has a multi-material surface in that some portions of the surface are top surfaces of structures of substrate 105 (existing before deposition of the planarization layer), while other surface portions are planarizing film 110. To prevent further solubility shifting of planarizing film 110, a post exposure bake can be executed that thermally treats the substrate to a temperature sufficient such that the planarizing film no longer reacts with solubility-changing agents.

Figure 6:
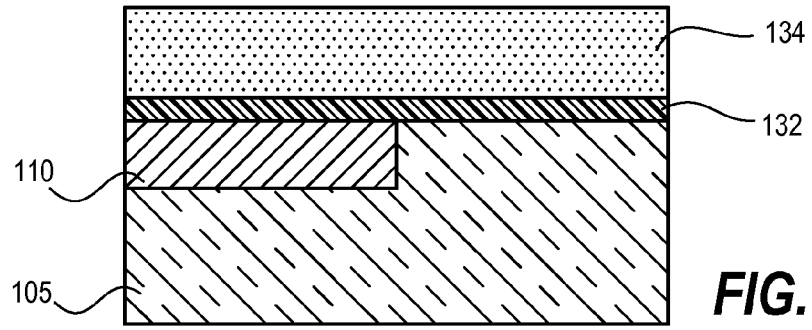
FIG. 6 is a cross-sectional schematic view of an example substrate segment showing a process flow according to embodiments disclosed herein.
Figure 7:
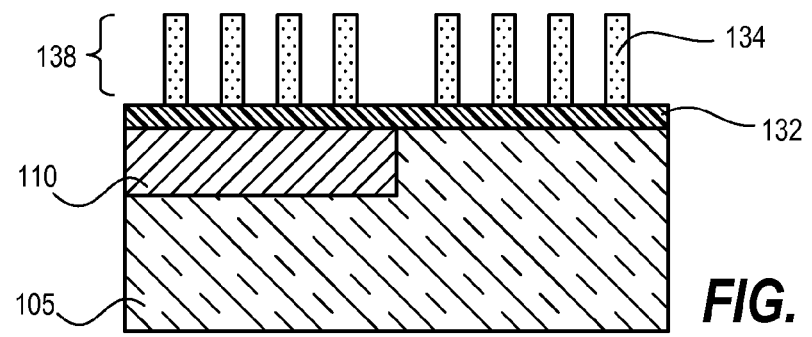
FIG. 7 is a cross-sectional schematic view of an example substrate segment showing a process flow according to embodiments disclosed herein.
Figure 8:
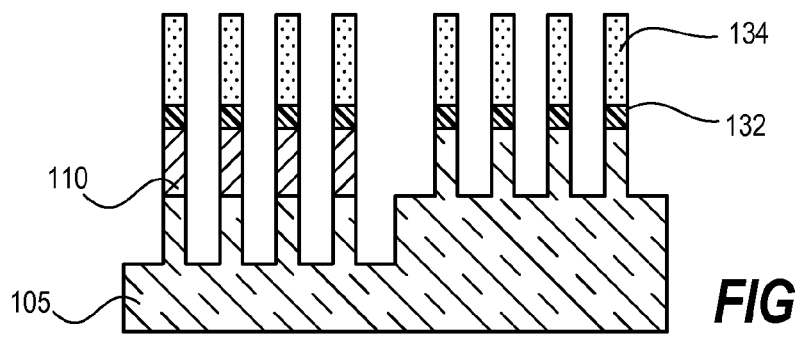
FIG. 8 is a cross-sectional schematic view of an example substrate segment showing a process flow according to embodiments disclosed herein.
Figure 9:
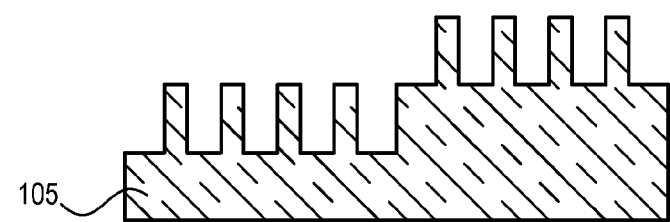
FIG. 9 is a cross-sectional schematic view of an example substrate segment showing a process flow according to embodiments disclosed herein.

With a planar surface 127 created via a developer tool, additional fabrication techniques can be continued. For example, subsequent patterning can be continued on a planar surface, and the planarization material can be etched through as needed to simultaneously etch underlying features of differing heights. Referring to FIG. 6, a BARC layer 132 can be applied, followed by depositing resist layer 134. Resist layer 134 can then be exposed to a pattern of electromagnetic radiation to create a latent pattern in resist layer 134. FIG. 7 shows a patterned resist 138 after being developed. Patterned resist 138 can then be used to etch features into the substrate stack, with a result shown in FIG. 8. Note that features can be etched at multiple different heights simultaneously. After etching operations, the mask layers can be removed leaving a patterned substrate, as shown in FIG. 9. Thus, with techniques herein, a non-planar substrate can be efficiently planarized using chemical planarization on a developer tool. Such developer tool-based planarization can improve efficiency and cost, as well as providing non-abrasive planarization that preserves less-robust structures, or needed thin films.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for planarizing a substrate, the method comprising:
receiving a substrate having first and second microfabricated structures wherein the first microfabricated structures differ in height relative to the second microfabricated structures such that the first and second microfabricated structures define a non-planar topography across an upper portion of the substrate;
depositing a planarizing film on the substrate such that the planarizing film yields a first planar surface on the upper portion of the substrate, the planarizing film including a solubility-changeable material;
depositing a solubility-changing agent on the first planar surface of the planarizing film;
activating the solubility-changing agent such that the solubility-changing agent changes a solubility of a top portion of the planarizing film, the top portion of the planarizing film having a thickness extending vertically from the first planar surface of the planarizing film to a predetermined depth within the planarizing film;
removing the top portion of the planarizing film resulting in the substrate having a target planar surface; and
after the removing, etching features into both the first and second microfabricated structures of the substrate through the target planar surface.

2. The method of claim 1, wherein activating the solubility-changing agent includes heating the solubility-changing agent such that the solubility-changing agent diffuses into the planarizing film to the predetermined depth and changes a solubility of the top portion of the planarizing film.

3. The method of claim 2, wherein heating the solubility-changing agent includes controlling heating parameters such that diffusion of the solubility-changing agent stops at about the predetermined depth.

4. The method of claim 2, wherein heating includes heating the substrate to between about 80 C and 100 C.

5. The method of claim 1, wherein depositing the planarizing film includes depositing a developable anti-reflective coating.

6. The method of claim 5, wherein the developable anti-reflective coating includes silicon.

7. The method of claim 1, wherein depositing the solubility-changing agent includes liquid deposition.

8. The method of claim 1, wherein the solubility-changing agent is an acid.

9. The method of claim 8, wherein depositing the solubility-changing agent includes synthesizing a photo acid without exposure to electromagnetic radiation.

10. The method of claim 1, wherein the solubility-changing agent a thermally-activated acid generator.

11. The method of claim 1, wherein removing the top portion of the planarizing film includes using a chemical developer to dissolve the top portion of the planarizing film.

12. The method of claim 1, wherein the predetermined depth is approximately equal to a distance from the first planar surface to a given structure on the substrate that is higher relative to other structures on the substrate.

13. The method of claim 1, further comprising creating a patterned layer of photoresist on the target planar surface via photolithography.

14. The method of claim 13, wherein the etching features uses the patterned layer of photoresist as a mask.

15. A method for planarizing a substrate, the method comprising:
receiving a substrate having first and second microfabricated structures wherein the first microfabricated structures differ in height relative to the second microfabricated structures such that the first and second microfabricated structures define a non-planar topography across an upper portion of the substrate;
depositing a planarizing film on the substrate such that the planarizing film yields a first planar surface on the upper portion of the substrate, the planarizing film including a solubility-changeable material;
depositing a solubility-changing agent on the first planar surface of the planarizing film;
activating the solubility-changing agent such that the solubility-changing agent changes a solubility of a top portion of the planarizing film, the top portion of the planarizing film having a thickness extending vertically from the first planar surface of the planarizing film to a predetermined depth within the planarizing film; and
removing the top portion of the planarizing film resulting in the substrate having a target planar surface,
wherein depositing the solubility-changing agent includes using vapor exposure deposition.

16. A method for planarizing a substrate, the method comprising:
receiving a substrate having first and second microfabricated structures wherein the first microfabricated structures differ in height relative to the second microfabricated structures such that the first and second microfabricated structures define a non-planar topography across an upper portion of the substrate;

depositing a planarizing film on the substrate such that the planarizing film yields a first planar surface on the upper portion of the substrate, the planarizing film including a solubility-changeable material;

depositing a solubility-changing agent on the first planar surface of the planarizing film;

activating the solubility-changing agent such that the solubility-changing agent changes a solubility of a top portion of the planarizing film, the top portion of the planarizing film having a thickness extending vertically from the first planar surface of the planarizing film to a predetermined depth within the planarizing film; and removing the top portion of the planarizing film resulting in the substrate having a target planar surface, wherein the solubility-changing agent is a base and the planarizing film includes a positive tone resist.

17. A method for planarizing a substrate, the method comprising:

receiving a substrate having first and second microfabricated structures wherein the first microfabricated structures differ in height relative to the second microfabricated structures such that the first and second microfabricated structures define a non-planar topography across an upper portion of the substrate;

depositing a planarizing film on the substrate such that the planarizing film yields a first planar surface on the upper portion of the substrate, the planarizing film including a solubility-changeable material;

depositing a solubility-changing agent on the first planar surface of the planarizing film;

activating the solubility-changing agent such that the solubility-changing agent changes a solubility of a top portion of the planarizing film, the top portion of the planarizing film having a thickness extending vertically from the first planar surface of the planarizing film to a predetermined depth within the planarizing film;

thermally treating the substrate such that the planarizing film no longer reacts with solubility-changing agents; and removing the top portion of the planarizing film resulting in the substrate having a target planar surface.

18. A method for planarizing a substrate, the method comprising:

receiving a substrate having first and second microfabricated structures wherein the first microfabricated structures differ in height relative to the second microfabricated structures such that the first and second microfabricated structures define a non-planar topography across an upper portion of the substrate;

depositing a planarizing film on the substrate such that the planarizing film yields a first planar surface on the upper portion of the substrate, the planarizing film including a solubility-changeable material;

depositing a solubility-changing agent on the first planar surface of the planarizing film, the solubility-changing agent diffusing into a top portion of the planarizing film to a predetermined depth and changing a solubility of the top portion of the planarizing film, the top portion of the planarizing film having a thickness extending vertically from the first planar surface of the planarizing film to the predetermined depth within the planarizing film;

removing the top portion of the planarizing film resulting in the substrate having a target planar surface; and after the removing, etching features into both the first and second microfabricated structures of the substrate through the target planar surface.

19. The method of claim 18, wherein the solubility-changing agent diffuses into the top portion of the planarizing film to the predetermined depth based on an amount of solubility-changing agent deposited on the first planar surface.

20. The method of claim 19, wherein the solubility-changing agent diffuses into the top portion of the planarizing film to the predetermined depth based on an amount of time that the solubility-changing agent remains on the first planar surface.

* * * * *